(12) United States Patent
Beck et al.

(10) Patent No.: US 8,138,411 B2
(45) Date of Patent: Mar. 20, 2012

(54) PHOTOVOLTAIC SYSTEM

(75) Inventors: Bernhard Beck, Volkach (DE); Tim Müller, Ottendorf-Okrilla (DE)

(73) Assignee: Adensis GmbH, Dresden (DE)

( * ) Notice: Subject to any disclaimer, the term of this patent is extended or adjusted under 35 U.S.C. 154(b) by 669 days.

(21) Appl. No.: 12/256,016

(22) Filed: Oct. 22, 2008

(65) Prior Publication Data
US 2009/0101191 A1 Apr. 23, 2009

(30) Foreign Application Priority Data
Oct. 23, 2007 (DE) .................. 10 2007 050 554

(51) Int. Cl.
*H01L 31/042* (2006.01)

(52) U.S. Cl. ........................................ 136/244; 136/293

(58) Field of Classification Search .................. 136/244, 136/293
See application file for complete search history.

(56) References Cited

U.S. PATENT DOCUMENTS

| | | | |
|---|---|---|---|
| 5,475,557 A * | 12/1995 | Larom et al. ................ | 361/46 |
| 6,891,313 B1 * | 5/2005 | Henneken et al. ............ | 310/328 |
| 2004/0165408 A1 | 8/2004 | West et al. | |
| 2005/0121067 A1 | 6/2005 | Toyomura et al. | |
| 2007/0177338 A1 * | 8/2007 | Nishi et al. ................ | 361/641 |
| 2009/0078304 A1 * | 3/2009 | Gilmore et al. ............. | 136/248 |

FOREIGN PATENT DOCUMENTS

| | | |
|---|---|---|
| DE | 29 03 559 | 12/1980 |
| DE | 20 2006 008936 | 8/2006 |
| DE | 10 2006 014780 | 10/2007 |

* cited by examiner

*Primary Examiner* — Alexa Neckel
*Assistant Examiner* — Miriam Berdichevsky
(74) *Attorney, Agent, or Firm* — Henry M. Feiereisen

(57) ABSTRACT

The photovoltaic system includes a plurality of photovoltaic modules which are connected to form a string or several strings connected in parallel, thereby forming a photovoltaic generator having a positive terminal and negative terminal. A DC constant voltage source connected to the photovoltaic generator to raise the potential of the positive terminal relative to ground potential. This reduces the flow of electrons out of the TCO layer of the modules, thereby reducing or completely eliminating cathode discharges which damage the modules.

9 Claims, 4 Drawing Sheets

PHOTOVOLTAIC SYSTEM

CROSS-REFERENCES TO RELATED APPLICATIONS

This application claims the priority of German Patent Application, Serial No. 10 2007 050 554.1, filed Oct. 23, 2007, pursuant to 35 U.S.C. 119(a)-(d), the content of which is incorporated herein by reference in its entirety as if fully set forth herein.

BACKGROUND OF THE INVENTION

The present invention relates to a photovoltaic system and more particularly to a photovoltaic system with a plurality of electrically connected photovoltaic modules.

Photovoltaic systems are generally known. These systems typically include a number of photovoltaic modules connected in series to form a so-called string. Each photovoltaic module in turn includes about 100 photovoltaic cells, which are also electrically connected in series. A single photovoltaic cell generates a voltage of about 0.5 V when illuminated by sunlight. As a result, each string has under load a voltage across the string of about 500 V depending on the specific application of the system. This voltage is also referred to as string voltage. In the following example, a string voltage of about 500V under load and of about 800 V under open-circuit conditions (no load) is assumed. Several strings, e.g. 10 strings, may be connected in parallel, with the generated energy then transmitted via a bus for further use.

The generated electrical energy is provided in form of a DC voltage which is converted into an AC voltage by an inverter. Typical conventional exemplary circuit diagrams are shown in FIGS. 1 and 2, where identical components are designated with identical reference symbols As shown in FIG. 1, the photovoltaic system includes a plurality of photovoltaic cells 3 connected in series and forming, in the illustrated example, two strings 5 which are connected in parallel. The photovoltaic generator 6 formed in this manner has a first string terminal 7 at a negative potential and a second string terminal 9 at a positive potential. The first string terminal is the negative terminal of the photovoltaic generator at a first (lower) potential P1, and the second string terminal is the positive terminal of the photovoltaic generator at a second (higher) potential P2. An inverter 11 is connected to the string terminals 7 and 9. The voltage between the two string ends 7, 9 under load is, as mentioned above, about 500 V.

As illustrated in FIG. 1, the photovoltaic system is operated at a fixed potential reference potential, i.e., the negative potential P1 is connected to ground 13, and the positive potential P2 is, commensurate with the number of serially connected photovoltaic cells of the two strings 5, about 500 V under load.

The basic disadvantage of the circuit of FIG. 1 is its high affinity to "attract" lightning due to the connection of the negative potential to ground. Accordingly, wide-ranging precautions must be taken to prevent lightning strikes which could destroy the inverter, causing a loss of several 100.000 €in larger systems. Alternatively, complex overvoltage protection devices would have to be installed, raising the overall price tag of the system 1. The components carrying high voltages must also be protected against accidental contact. There is a danger of an electric shock for a person standing on the ground who touches lines or conductor parts at, for example, the maximum line voltage $U_0$. All bare components installed in the system must therefore be grounded.

It has been observed that a very small, but measurable current can flow from the individual modules 3 to ground 13, but that the modules 3 are not damaged even after prolonged operation under normal conditions.

The second circuit diagram shown in FIG. 2 includes, to simplify the drawing, in the photovoltaic generator 6 only a single string 5 constructed of serially connected modules 3. This photovoltaic system 1 reduces the risk for lightning strikes and eliminates the danger of an electric shock for bystanders, but has another disadvantage. The magnitude of the voltage at each of the two string terminals 7, 9 is about the same with reference to ground 13 in the illustrated so-called potential-free operation of the photovoltaic system 1. The positive potential P2 to ground 13 under open circuit conditions ($U_0$=800 V) is in this example about +400 V, while the negative potential P1 to ground 13 is also about −400V. These voltages to ground are caused, in spite of the potential-free operation, by a non-negligible relatively small conductance (=the inverse of the ohmic resistance) of the relative the long connecting lines between the modules 3 (wiring of the system 1) and the cables to the inverter 11. The small conductance is symbolized in the schematic circuit diagram by a resistor 14, which is connected approximately between the center of the series connection 5 of the modules 3 and ground 13. Parasitic discharges to ground 13 then become finite and the potential with reference to ground 13 is distributed as mentioned above, i.e., +400 V and −400 V, which represents the most advantageous energy distribution for the overall system 1.

It has been observed that a discharge from anodes, i.e., a discharge from the part of the photovoltaic system 1 with a positive potential to ground, does not damage the affected photovoltaic modules 3. Conversely, a discharge from cathodes causes damage to the photovoltaic modules over an extended period of time, damaging (eroding) the edge region of the TCO layer of the photovoltaic modules 3 and causing a premature permanent power drop. The TCO layer is typically referred to as the semiconductor layer in a module 3 which is disposed between two glass panes. Several exemplary discharges are depicted in FIG. 2 by the arrows 15a, 15b, 17a, 17b.

It should be mentioned that electrons flow from the top modules 3a at a positive potential to the bottom modules 3b at a negative potential, as shown by arrows 15a. This is referred to as "electron absorption." The arrows 15a extending from module to module indicate a "cathode discharge." A small "anode discharge" may also occur as indicated by the module to module arrows 15b pointing in the opposite direction. As already mentioned, "electron absorption" can damage the modules 3b during their service life.

Other "cathode discharges" are symbolized by arrows 17a. In this case, the voltage division by resistor 14 causes electrons to flow from the bottom modules 3b to ground 13. A small "anode discharge" is also present, as indicated by arrows 17b. These "cathode discharges" (arrows 17a) should also be prevented if possible.

In case of an electrical fault, conventional equipment with potentially exposed electrical high-voltage components puts service personnel at risk. A check can only be performed with a voltage tester and by systematically contacting all conductors. This may take several weeks in large high-power photovoltaic systems and is therefore not practical.

In addition, it is also not possible to detect when one or more parallel-connected strings 5 of photovoltaic modules 3 are disconnected, either because these modules 3 became defective or due to theft.

Accordingly, there is a need to keep cathode discharges on modules as small as possible or to eliminate them entirely, and to provide the system against lightning strikes. There is further a need to protect personnel from accidental electric shock and to detect theft.

SUMMARY OF THE INVENTION

The disclosed system according to the invention essentially eliminates "cathode discharges" and thereby prevent damage in the edge regions of the solar modules.

According to one aspect of the present invention, a photovoltaic system includes a photovoltaic generator with a plurality of photovoltaic modules electrically connected in form of at least one string. A first terminal of the photovoltaic generator has a first potential of negative polarity and a second terminal of the photovoltaic generator has a second potential of positive polarity. A device which includes a DC voltage source is connected to one of the first or second terminal of the photovoltaic generator for raising the first or second potential relative to ground.

With this measure, the negative potential is shifted up, preferably to a positive value with respect to ground potential, which reduces or completely eliminates "cathode discharges", i.e., flow of electron into the various modules.

According to another advantageous feature of the invention, the photovoltaic system may also include a potential-free inverter having a DC input terminals connected to the terminals of the photovoltaic generator in one-to-one correspondence. This inverter generates an AC output for supplying power mains.

According to another advantageous feature of the invention, the DC voltage source may be a constant voltage source having a predetermined output voltage, for example, between 150V and 1500V.

According to another advantageous feature of the invention, the photovoltaic may include a switch detecting a leakage current between the photovoltaic generator and ground potential, wherein the switch disconnects the DC voltage source from the photovoltaic system and/or the ground potential, if the leakage current is greater than a predetermined limit current.

According to another advantageous feature of the invention, a current sensor may be connected between ground potential and the negative terminal of the DC voltage source, measuring a leakage current. A comparator receives at first and second inputs the predetermined limit current and the leakage current and outputs a disconnect signal if the detected leakage current is greater than a predetermined limit current. The disconnect signal actuates the switch which in response disconnects the DC voltage source from the photovoltaic system and/or the ground potential. Instead or in addition to the disconnect signal, the comparator may also output an alarm signal form transmission to an alarm system.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
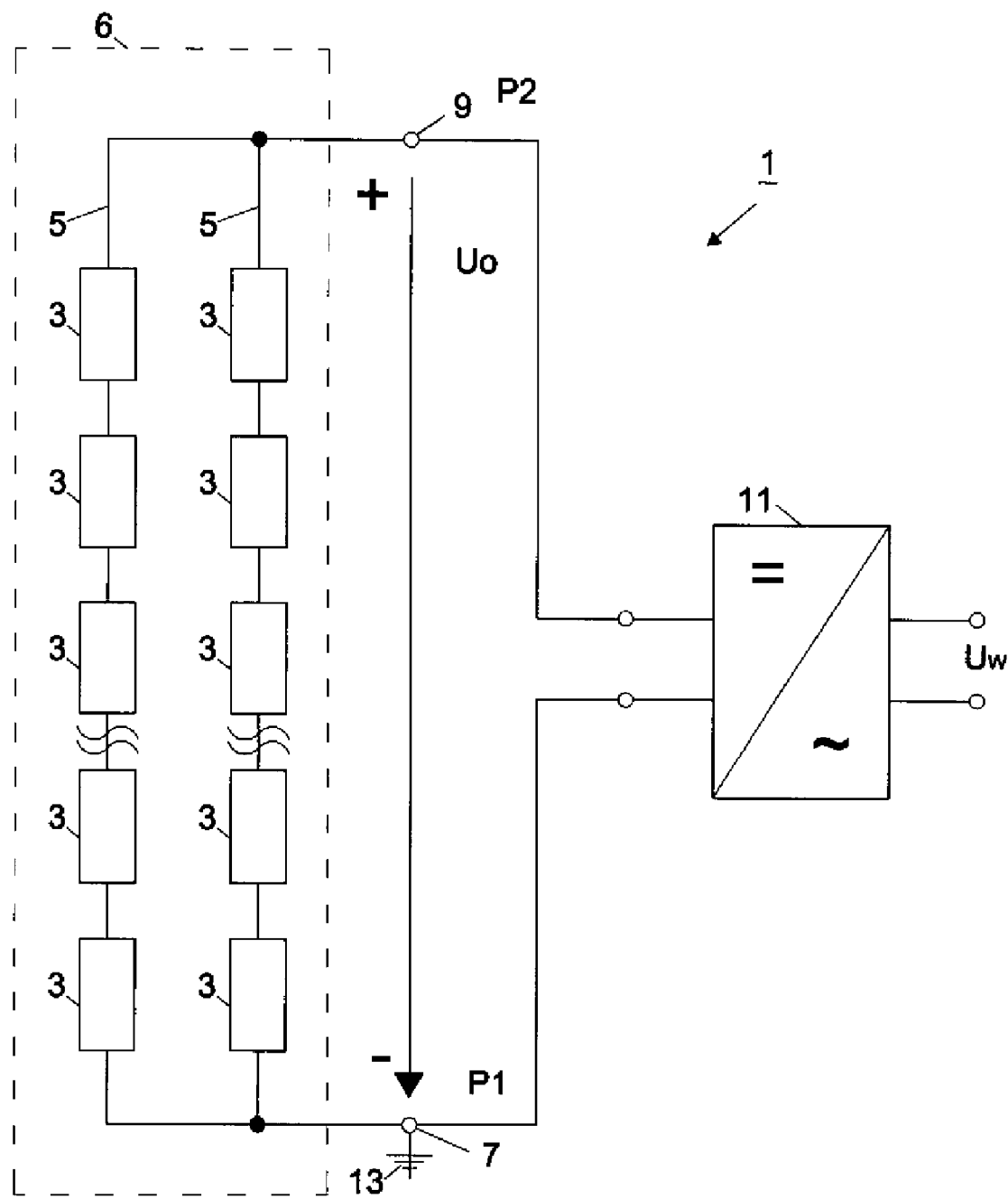
FIG. 1 is a schematic diagram of a conventional grounded photovoltaic system.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 2:
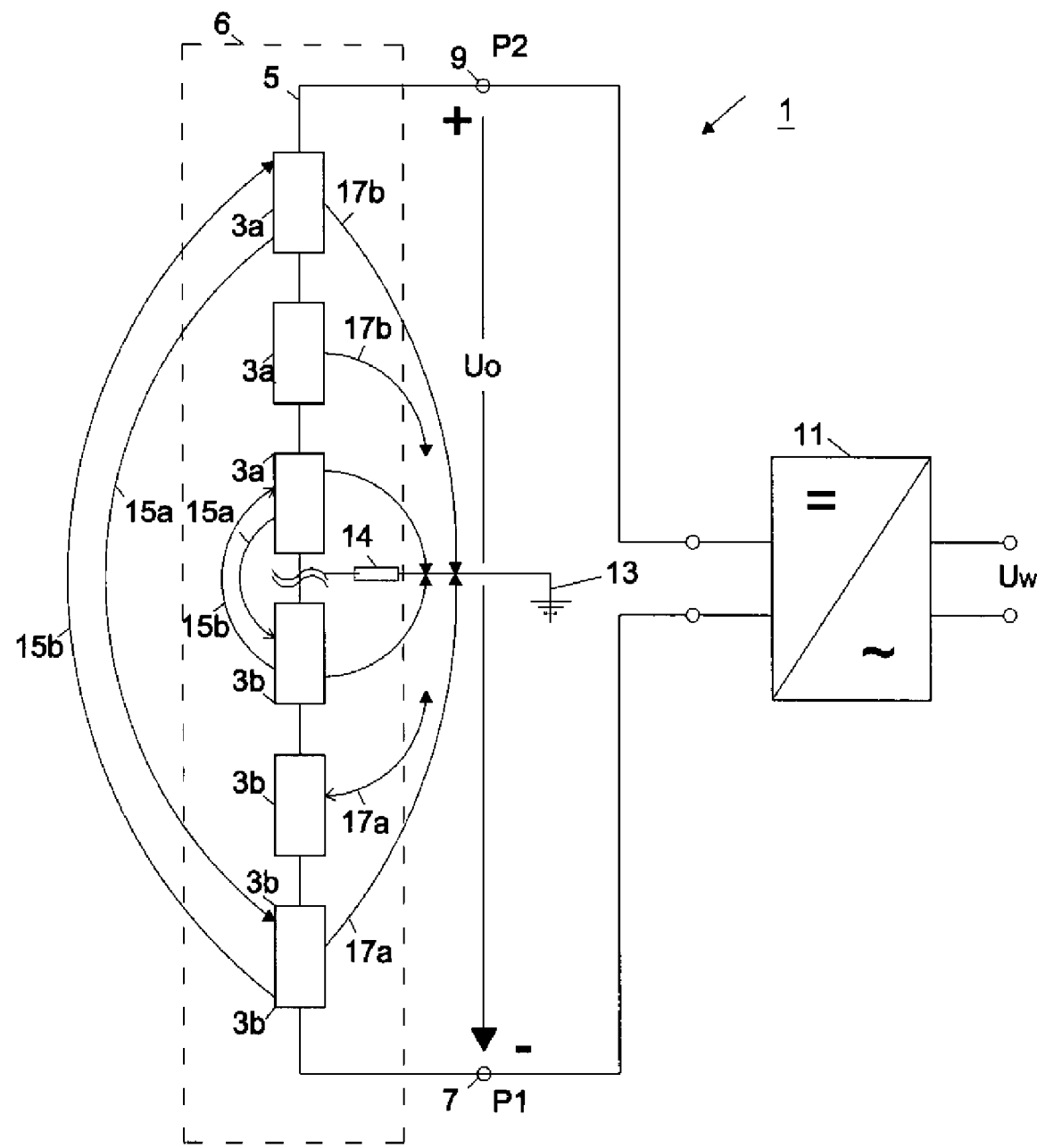
FIG. 2 is a schematic diagram of a conventional potential-free photovoltaic system.

Turning now to the drawing, and in particular to FIGS. 1 and 2, there are shown schematic diagrams of a conventional grounded and a conventional potential-free photovoltaic system 1, respectively, which have already been described above. The photovoltaic system 1 in FIG. 1 is grounded, i.e. the negative potential P1 at the first string terminal 7 is connected to ground potential 13. The open circuit voltage of this arrangement is, as mentioned above, approximately 800 V. Conversely, the photovoltaic system 1 in FIG. 2 is potential-free, i.e., each string 7, 9 has about the same voltage, with P2 about +400 V against ground 13 and P2 about −400 V against ground 13. Because air is not an ideal insulator, electrons exit from the modules 3a having a positive voltage with respect to ground 13 and enter the modules 3b having a negative voltage with respect to ground 13. The electrons entering the TCO layer of the photovoltaic modules 3b damage (erode) the edge region of the layer, which can be prevented by employing the measures shown in FIGS. 3 and 4.

Figure 3:
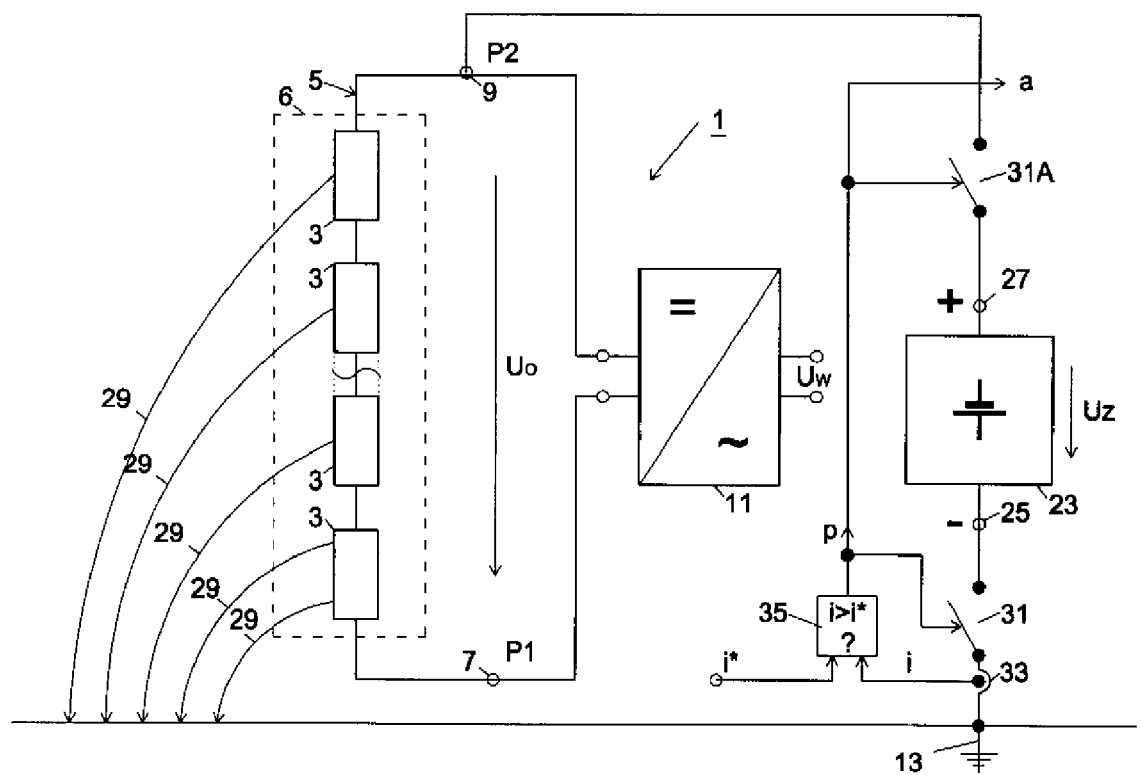
FIG. 3 is a schematic diagram of a first embodiment of a potential-free photovoltaic system with an elevated potential.

In a first embodiment according to the invention illustrated in FIG. 3, a DC voltage source 23 with a positive terminal 27 and a negative terminal 25 supplies a constant voltage of, for example, $U_z$=1000 V. When the positive terminal 27 is connected to the second string terminal 9, the voltage at the second string terminal 9 has a positive potential P2 of +1000 V, whereas the negative potential P1 is floating. If the voltage $U_0$=800 V across the string 5 is subtracted from $U_z$=1000 V, then the potential P1 at the first string terminal 7 becomes +200V under open circuit conditions, and +500V under load. The potential P1 is therefore positive which is quite important. I.e., all the photovoltaic modules 3 have a positive potential with respect to ground 13, and the electrons are discharged from each positive module 3 to ground. The disadvantages resulting from electrons exiting the negative TCO layer of the modules is thereby eliminated.

Regulations from regulatory agencies as well as limited technical options may limit the voltage to which the potential P1 can be raised. However, even this limitation represents an improvement by significantly reducing electron absorption 17.

The discharge path is indicated by arrows 29. The discharge from modules 3, which are at a positive potential, is referred to as "anode discharge." The discharges indicated by reference symbol 29 are therefore "anode discharges" which are harmless for the modules 3.

In addition, even the bottom module 3 is at a positive potential relative to ground 13 which reduces the risk of a lightning strike.

It was mentioned above that the device 23 for raising the potential is a constant voltage DC source. It should be mentioned that the higher the additional voltage $U_z$ of the constant DC voltage source 23, the greater is the protection against a lightning strike. It should also be mentioned that even an additional voltage $U_z$ of "only" about 600V significantly reduces harmful "cathode discharges" and hence also reduces the risk of damage to the modules 3.

The same effects are attained if the device 23 is a constant DC current source.

The system 1 illustrated in FIG. 3 also includes means for protecting personnel in form of a safety switch 31 or an alternative circuit breaker 31A. This arrangement protects a person who accidentally touches a part of the system 1. The switch 31 or 31A is configured so that the constant voltage source 23 is disconnected when a predetermined limit current i* is reached. In other words, current i does then no longer flow through the body of the endangered person. The current value i* for the maximum allowable leakage current i can be, for example, 20 mA. It will be understood that in addition, an alarm signal "a" can be generated for sounding an alarm.

Figure 4:
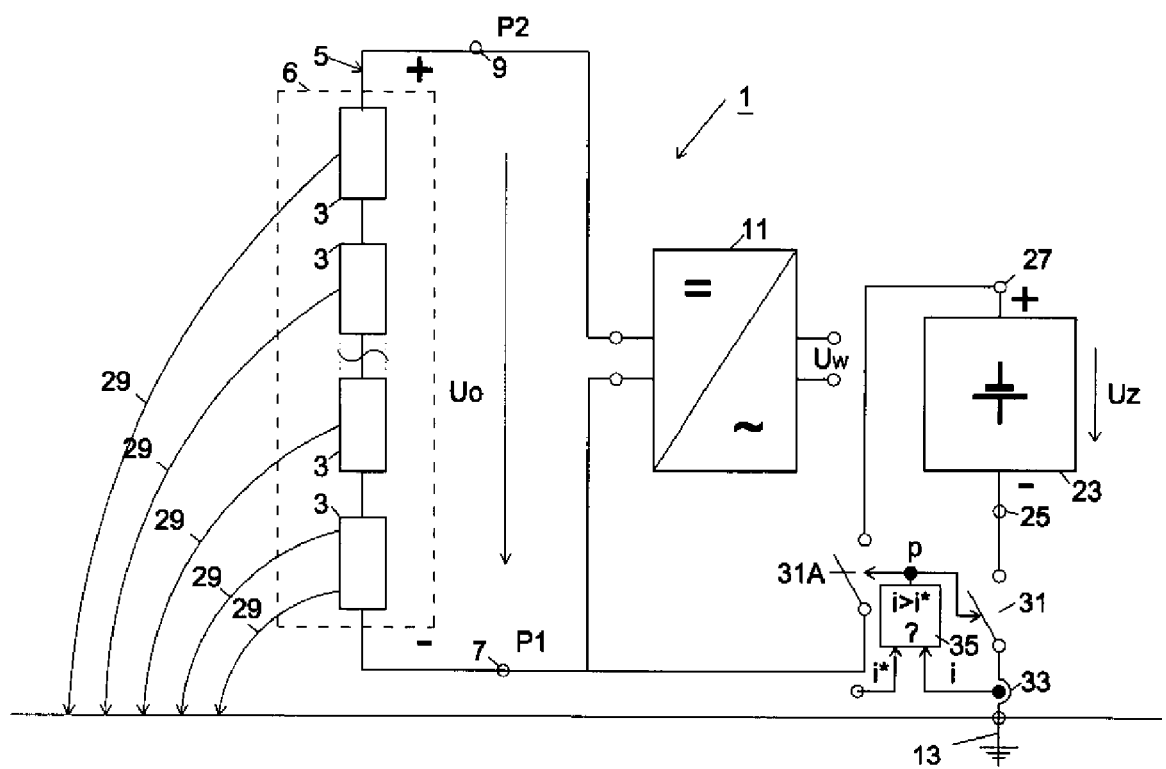
FIG. 4 is a schematic diagram of a second embodiment of a potential-free photovoltaic system with an elevated potential.

The same concept applies to a system 1 illustrated in FIG. 4. The terminal P1 is here connected with the positive terminal 27 of the DC constant voltage source 23. The negative terminal 25 is connected via the safety switch 21 to ground 13, resulting in the arrows 29 already described with reference to FIG. 2 for anode discharges which are harmless for the modules 3.

In other words: to prevent endangerment of personnel, a safety switch 31 or alternatively a circuit breaker 31A are employed which are used to disconnect at a suitable location the connection between the ground 13 and terminal 27 of the DC voltage source 23. This switch 31, 31A has the function of a FI protective switch. Instead of a leakage current switch 31, 31A, a sensor or current measurement device 33 may be connected in-line, which measures the current i through the sensor 33 and supplies a corresponding measurement value to a comparator 35, which also receives a predetermined current limit value i*. If the value of the current i exceeds the limit value i*, then a disconnect signal p is transmitted which causes the switch 31 or 31A to switch off, thereby disconnecting one or both terminals of the DC voltage source 23 from the photovoltaic generator. This disconnect signal p can also operate as alarm signal a to indicate the dangerous state of the system 1 or the endangerment of a person.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A photovoltaic system comprising:
    a photovoltaic generator comprising a plurality of photovoltaic modules electrically connected in form of at least one string, with a first terminal of the photovoltaic generator having a first potential of negative polarity and a second terminal of the photovoltaic generator having a second potential of positive polarity, and
    a device comprising a DC voltage source having a negative terminal connected to ground and a positive terminal which is connected to one of the first or second terminal of the photovoltaic generator for raising the first or second potential relative to ground.

2. The photovoltaic system of claim 1, further comprising a potential-free inverter having a DC input terminals connected to the terminals of the photovoltaic generator in one-to-one correspondence.

3. The photovoltaic system of claim 1, wherein the DC voltage source is a constant voltage source having a predetermined output voltage.

4. The photovoltaic system of claim 3, wherein the predetermined output voltage is between 150 V and 1500 V.

5. The photovoltaic system of claim 1, further comprising a switch detecting a leakage current between the photovoltaic generator and ground potential, said switch disconnecting the DC voltage source from at least one of the photovoltaic system and the ground potential, if the leakage current is greater than a predetermined limit current.

6. The photovoltaic system of claim 5, further comprising
    a current sensor connected between ground potential and the negative terminal of the DC voltage source and measuring the leakage current, and
    a comparator having first and second inputs, with the first input receiving the predetermined limit current and the second input receiving the leakage current, said comparator outputting a disconnect signal if the leakage current is greater than a predetermined limit current, said disconnect signal causing the switch to disconnect the DC voltage source from at least one of the photovoltaic system and the ground potential.

7. The photovoltaic system of claim 6, wherein the comparator outputs an alarm signal if the leakage current is greater than a predetermined limit current.

8. The photovoltaic system of claim 1, wherein the constant voltage source applies a signal across the terminals of the photovoltaic generator.

9. The photovoltaic system of claim 1, wherein all photovoltaic modules have a positive potential with respect to ground.

\* \* \* \* \*